(12) United States Patent
Matsutou

(10) Patent No.: US 10,613,152 B2
(45) Date of Patent: Apr. 7, 2020

(54) BATTERY MONITORING DEVICE AND POWER STATE MONITORING METHOD

(71) Applicant: Toyota Jidosha Kabushiki Kaisha, Toyota-shi, Aichi-ken (JP)

(72) Inventor: Hidenori Matsutou, Toyota (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 0 days.

(21) Appl. No.: 16/146,091

(22) Filed: Sep. 28, 2018

(65) Prior Publication Data

US 2019/0162794 A1 May 30, 2019

(30) Foreign Application Priority Data

Nov. 24, 2017 (JP) ................. 2017-225802

(51) Int. Cl.
*G01R 31/396* (2019.01)

(52) U.S. Cl.
CPC .................. *G01R 31/396* (2019.01)

(58) Field of Classification Search
CPC ...... G01N 27/20; G01N 27/041; G01N 17/04; G01M 5/0083; G01M 5/0016
USPC ................. 324/693, 691, 649, 600
See application file for complete search history.

(56) References Cited

U.S. PATENT DOCUMENTS

| | | | | |
|---|---|---|---|---|
| 4,827,212 A | * | 5/1989 | Kamieniecki | G01R 31/2656 324/754.23 |
| 4,914,395 A | * | 4/1990 | Hamada | G01M 3/40 324/514 |
| 6,729,922 B2 | * | 5/2004 | Hiroki | G01R 31/302 324/537 |
| 2011/0205770 A1 | | 8/2011 | Isogai et al. | |
| 2015/0102820 A1 | | 4/2015 | Mizobe et al. | |
| 2015/0293178 A1 | | 10/2015 | Fujii | |
| 2017/0069696 A1 | * | 3/2017 | Kondo | H01L 27/3276 |
| 2017/0077190 A1 | * | 3/2017 | Hashimoto | G09F 9/30 |
| 2017/0098398 A1 | * | 4/2017 | Amatsuchi | G09G 3/006 |

FOREIGN PATENT DOCUMENTS

| | | |
|---|---|---|
| JP | 2011-176926 A | 9/2011 |
| JP | 2014-082152 A | 5/2014 |
| JP | 2015-080289 A | 4/2015 |
| JP | 2016-161352 A | 9/2016 |

* cited by examiner

*Primary Examiner* — Giovanni Astacio-Oquendo
(74) *Attorney, Agent, or Firm* — Dinsmore & Shohl LLP

(57) ABSTRACT

Provided is a battery monitoring device for a battery including a plurality of battery stacks. The battery monitoring device includes a plurality of monitoring modules, a power supply device, and a determination module. The power supply device includes a plurality of first power lines, a first switch, a first capacitor, a second power line, a plurality of second switches, and a plurality of second capacitors. The determination module is configured to determine a state of power supply from the power supply device to the monitoring modules. Each of the first power lines includes a first positive electrode line and a first negative electrode line, and is connected to the monitoring modules so as to supply power to the monitoring modules. The second power line includes a second positive electrode line and a second negative electrode line, and is configured to receive a predetermined amount of power.

6 Claims, 4 Drawing Sheets

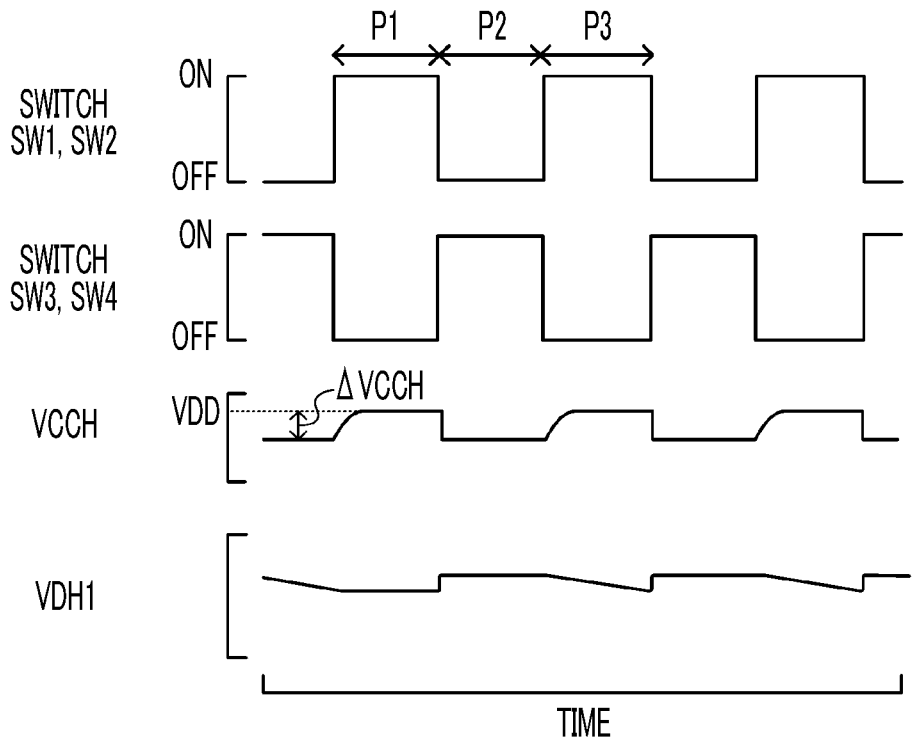
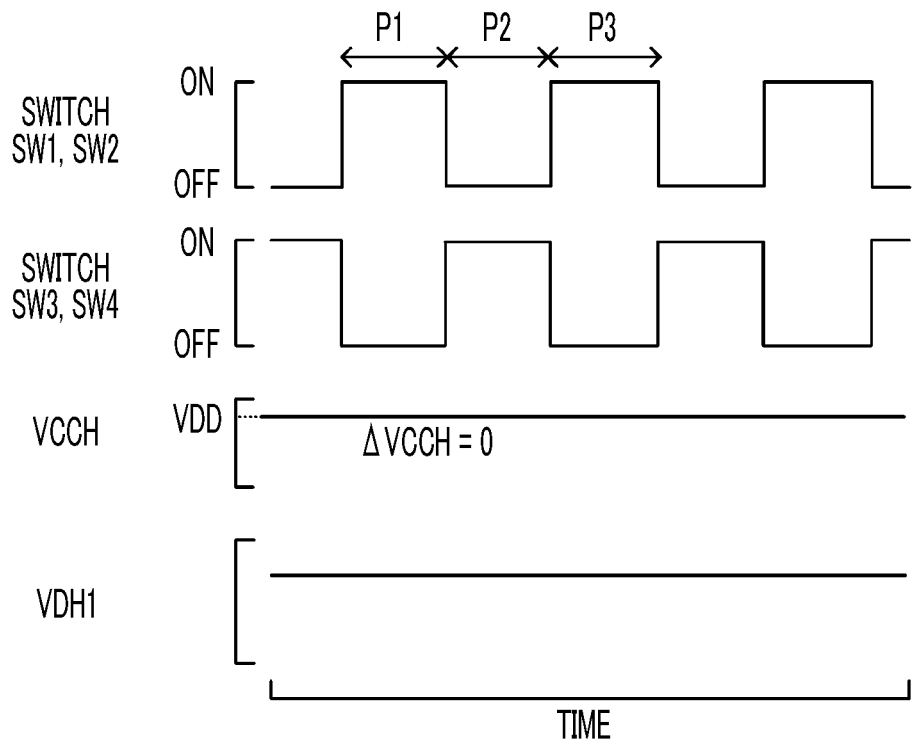

BATTERY MONITORING DEVICE AND POWER STATE MONITORING METHOD

CROSS-REFERENCE TO RELATED APPLICATIONS

This application claims priority to Japanese Patent Application No. 2017-225802 filed on Nov. 24, 2017, which is incorporated herein by reference in its entirety including the specification, drawings and abstract.

BACKGROUND

1. Technical Field

The present disclosure relates to a battery monitoring device and a power state monitoring method.

2. Description of Related Art

As a battery monitoring device in a related field, a battery monitoring device including a plurality of monitoring modules (monitoring integrated circuit (IC)), a power supply device (power source), and a determination module (upper electronic control unit (ECU)) has been proposed (see, for example, Japanese Unexamined Patent Application Publication No. 2015-080289 (JP 2015-080289 A)). Each of the monitoring modules is provided in a corresponding one of a plurality of battery cells constituting a battery, and monitors the battery cells in a plurality of operation modes. The power supply device supplies a power received from a power source IC to the monitoring modules via a transformer or a rectifier circuit. According to the operation mode of the monitoring module, the power supply device selects a power source for supplying a power to the monitoring module from between the battery and the power supply device.

SUMMARY

In the battery monitoring device described above, when an abnormality occurs in power supply from a power supply device to a monitoring module, the monitoring module cannot properly monitor a battery cell. When an abnormality occurs in power supply to some of a plurality of monitoring modules, various controls may be possible using information on a battery stack obtained from the monitoring module in which the abnormality does not occur. Therefore, it is desirable to separately determine a state of power supply from the power supply device.

The present disclosure provides a battery monitoring device and a power state monitoring method for separately determining a state of power supply between a plurality of monitoring modules and a power supply device.

A first aspect of the present disclosure relates to a battery monitoring device for a battery including a plurality of battery stacks. The battery monitoring device includes a plurality of monitoring modules, a power supply device, and a determination module. Each of the monitoring modules is disposed in a corresponding one of the battery stacks and is configured to monitor a state of the corresponding one of the battery stacks. The power supply device includes a plurality of first power lines, a first switch, a first capacitor, a second power line, a plurality of second switches, and a plurality of second capacitors. Each of the first power lines includes a first positive electrode line and a first negative electrode line. Each of the first power lines is connected to a corresponding one of the monitoring modules so as to supply power to the monitoring modules. The second power line includes a second positive electrode line and a second negative electrode line. The second power line is configured to receive a predetermined amount of power. The first capacitor is configured to be connected to the second positive electrode line and the second negative electrode line of the second power line via the first switch and to be connected to the first power lines via the second switches. Each of the second capacitors is configured to be connected to the first positive electrode line and the first negative electrode line of a corresponding one of the first power lines. The determination module is configured to determine a state of power supply from the power supply device to the monitoring modules.

In the battery monitoring device according to the first aspect of the present disclosure, the first switch is turned on, the second switches are all turned off, and then the first capacitor is charged. Thereafter, the first switch is turned off, and the second switches provided in the positive electrode line and the negative electrode line of the first power line for supplying power to the target monitoring module, which is a target for determining the state of power supply, are turned on, and thus the first capacitor and the second capacitors of the first power line for supplying power to the target monitoring module are connected in parallel. When the first capacitor and the second capacitors are connected in parallel, since an electric charge can be exchanged between the first capacitor and the second capacitors, a voltage of the first capacitor becomes a voltage corresponding to charging states of the second capacitors. The charging states of the second capacitors vary depending on the state of power supply from the first power line corresponding to the target monitoring module to the target monitoring module. Therefore, a change amount in the voltage of the first capacitor is a voltage obtained by reflecting the charging states of the second capacitors. When the first switch is turned on, and the second switches that have been turned on are turned off, the first capacitor is charged again and the voltage of the first capacitor changes. At this time, the change amount in the voltage of the first capacitor varies depending on a change amount in the voltage of the first capacitor of when the first capacitor and the second capacitors are connected in parallel. Therefore, it is possible to determine the state of power supply from the power supply device to the target monitoring module by using the change amount in the voltage of the first capacitor. By changing the target monitoring module, it is possible to separately determine the state of power supply between the monitoring modules and the power supply device.

In the battery monitoring device according to the first aspect of the present disclosure, the determination module may be configured to determine the state of power supply by using an increase amount in a voltage of the first capacitor of when the first capacitor is charged. According to the first aspect of the present disclosure, the state of power supply between the monitoring modules and the power supply device can be separately determined.

In the battery monitoring device according to the first aspect of the present disclosure, the determination module may be configured to prohibit determination of the state of power supply within a predetermined time after the battery monitoring device is activated. When at least one of the second capacitors has the number of times of charging less than a predetermined number, the determination module may be configured to prohibit determination of the state of power supply for the monitoring module to which power is supplied from the first power line connected to the second capacitor having the number of times of charging less than the predetermined number. The "predetermined time" is a threshold for determining whether or not a determination timing is immediately after the battery monitoring device is activated. The "predetermined number" is a threshold for determining whether or not a voltage of the second capacitor increases sufficiently immediately after the battery monitoring device is activated. When the voltage of the second capacitor does not increase sufficiently immediately after the battery monitoring device is activated, the increase amount in the voltage of the first capacitor becomes large regardless of the state of power supply between the monitoring modules and the power supply device. Therefore, the state of power supply between the monitoring modules and the power supply device cannot be accurately determined. In the first aspect of the present disclosure, when the determination timing is within a predetermined lime after the battery monitoring device is activated or at least one of the second capacitors has the number of times of charging less than the predetermined number, the state of power supply is not determined for the monitoring module to which power is supplied from the first power line connected to the second capacitor having the number of times of charging less than the predetermined number, and thus it is possible to more accurately determine the stale of power supply between the monitoring modules and the power supply device.

A second aspect of the present disclosure relates to a power state monitoring method of a battery monitoring device for a battery. The battery includes a plurality of battery stacks. The battery monitoring device includes a plurality of monitoring modules and a power supply device. Each of the monitoring modules is disposed in a corresponding one of the battery stacks and is configured to monitor a state of the corresponding one of the battery stacks. The power supply device includes a plurality of first power lines, a first switch, a first capacitor, a second power line, a plurality of second switches, and a plurality of second capacitors. Bach of the first power lines includes a first positive electrode line and a first negative electrode line. Each of the first power lines is connected to a corresponding one of the monitoring modules so as to supply power to the monitoring modules. The second power line includes a second positive electrode line and a second negative electrode line. The second power line is configured to receive a predetermined amount of power. The first capacitor is configured to be connected to the second positive electrode line and the second negative electrode line of the second power line via the first switch and to be connected to the first power lines via the second switches. Each of the second capacitors is configured to be connected to the first positive electrode line and the first negative electrode line of a corresponding one of the first power lines. The power state monitoring method includes determining a state of power supply from the power supply device to the monitoring modules by using an increase amount in a voltage of the first capacitor of when the first capacitor is charged.

In the power state monitoring method according to the second aspect of the present disclosure, the first switch is turned on, and the second switches are all turned off, and then the first capacitor is charged. Thereafter, the first switch is turned off, and the second switches provided in the positive electrode line and the negative electrode line of the first power line for supplying power to the target monitoring module, which is a target for determining the state of power supply, are turned on, and thus the first capacitor and the second capacitors of the first power line for supplying power to the target monitoring module are connected in parallel. When the first capacitor and the second capacitors are connected in parallel, since an electric charge can be exchanged between the first capacitor and the second capacitors, the voltage of the first capacitor becomes a voltage corresponding to charging states of the second capacitors. The charging states of the second capacitors vary depending on the state of power supply from the first power line corresponding to the target monitoring module to the target monitoring module. Therefore, the voltage of the first capacitor becomes a voltage obtained by reflecting the charging states of the second capacitors. When the first switch is turned on, and the second switches that have been turned on are turned off, the first capacitor is charged again and the voltage of the first capacitor increases. At this time, the increase amount in the voltage of the first capacitor varies depending on the change amount in the voltage of the first capacitor of when the first capacitor and the second capacitors are connected in parallel. Therefore, it is possible to determine the state of power supply from the power supply device to the target monitoring module by using the increase amount in the voltage of the first capacitor of when the first capacitor is charged. By changing the target monitoring module, it is possible to separately determine the state of power supply between the monitoring modules and the power supply device.

BRIEF DESCRIPTION OF THE DRAWINGS

Features, advantages, and technical and industrial significance of exemplary embodiments of the present disclosure will be described below with reference to the accompanying drawings, in which like numerals denote like elements, and wherein:

FIG. 3 is a timing chart showing an example of temporal changes of on-off states of switches, a voltage of a first capacitor, and a voltage of a second capacitor of when a state of power supply from a power supply device to a monitoring module is normal;

FIG. 4 is a timing chart showing an example of temporal changes of on-off states of the switches, a voltage of the first capacitor, and a voltage of the second capacitor of when a disconnection occurs in a first power line between the power supply device and the monitoring module, or in a power supply system within the monitoring module.

DETAILED DESCRIPTION OF EMBODIMENTS

An embodiment of the present disclosure will be described below.

Figure 1:
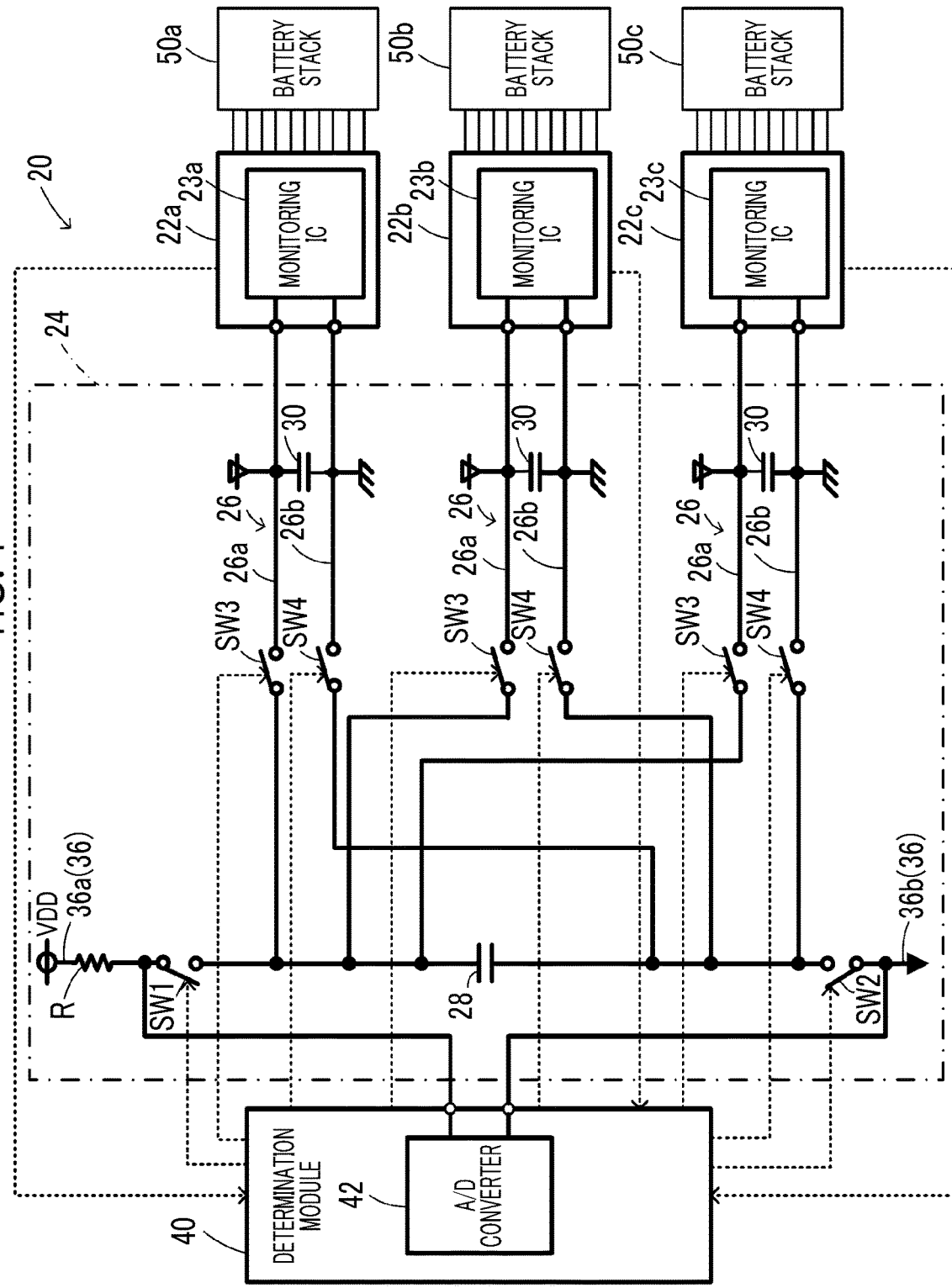
FIG. 1 is a configuration diagram showing a schematic configuration of a battery monitoring device according to an embodiment of the present disclosure.

FIG. 1 is a configuration diagram showing a schematic configuration of a battery monitoring device 20 according to an embodiment of the present disclosure. The battery monitoring device 20 includes monitoring modules 22a to 22c, a power supply device 24, and a determination module 40. The battery monitoring device 20 is mounted on a vehicle together with a battery (not shown) including battery stacks 50a to 50c composed of a plurality of battery cells. Examples of the vehicle equipped with the battery monitoring device 20 described above include an electric vehicle that drives a motor with a power obtained from a battery, or the like.

As shown in FIG. 1, the monitoring modules 22a to 22c are provided in the battery slacks 50a to 50c, respectively. The monitoring module 22a incorporates a monitoring IC 23a. A cell voltage of each battery cell of the corresponding battery stack 50a, the temperature of the battery stack 50a, and the like are input to the monitoring IC 23a. The monitoring module 22a monitors the input cell voltage, the input temperature of the battery stack 50a, and the like. The monitoring module 22a determines whether or not an abnormality occurs in the battery stack 50a by using the input cell voltage, the input temperature of the battery stack 50a, and the like. Like the monitoring module 22a, the monitoring modules 22b, 22c incorporate monitoring ICs 23b, 23c, respectively. The monitoring modules 22b, 22c determine whether or not an abnormality occurs in the battery stack 50b, 50c by using the cell voltages of respective battery cells of the corresponding battery stacks 50b, 50c, the temperatures of the battery stacks 50b, 50c, and the like.

The power supply device 24 is configured as a device that supplies power to the monitoring modules 22a to 22c by using each of three first power lines 26 provided in a corresponding one of the monitoring modules 22a to 22c. The power supply device 24 includes a first capacitor 28 and three second capacitors 30. The first capacitor 28 is connected to a positive electrode line 36a of a second power line 36 to which a power of a power source voltage VDD (for example, 5 V) is input via a resistor R and a switch SW1, and is connected to a negative electrode line 36b of the second power line 36 grounded via a switch SW2. The first capacitor 28 is also connected to positive electrode lines 26a and negative electrode lines 26b of the three first power lines 26 via each of switches SW3, SW4 provided in a corresponding one of the positive electrode lines 26a and the negative electrode lines 26b of the three first power lines 26. Each of the three second capacitors 30 is provided in a corresponding one of the three first power lines 26. The three second capacitors 30 are connected to the first capacitor 28 on the monitoring modules 22a to 22c sides via the switches SW3, SW4 provided in the corresponding first power lines 26. When the switches SW2, SW1 are turned off, the negative electrode line 26b of the first power line 26 is grounded in a state of being insulated from the negative electrode line 36b of the second power line 36. The capacity of the second capacitor 30 is adjusted to a capacity in which a voltage VDH1 of the second capacitor 30 gradually decreases with respect to the power consumption due to the operation of the monitoring module 22a.

Although not shown, the determination module 40 is configured with a microcomputer mainly including a CPU. The determination module 40 includes a read only memory (ROM) for storing a processing program, a random access memory (RAM) for temporarily storing data, and an A/D converter 42, in addition to the CPU. The A/D converter 42 is connected to the first capacitor 28 via the switches SW1, SW2. When the switches SW1, SW2 are turned on, the A/D converter 42 inputs a voltage VCCH of the first capacitor 28 as an analog value, converts the input voltage VCCH into a digital value, and outputs the converted digital value to the CPU or the like. The determination module 40 receives an abnormality determination signal as to whether or not the abnormality occurs in the battery stacks 50a to 50c from the monitoring modules 22a to 22c. The determination module 40 outputs switching signals to the switches SW1 to SW4.

In the battery monitoring device 20 according to the embodiment configured as described above, when the abnormality determination signal indicating that the abnormality has occurred in at least one of the battery stacks 50a to 50c is input from the monitoring modules 22a to 22c, the determination module 40 executes various controls according to the input abnormality determination signal.

Figure 2:
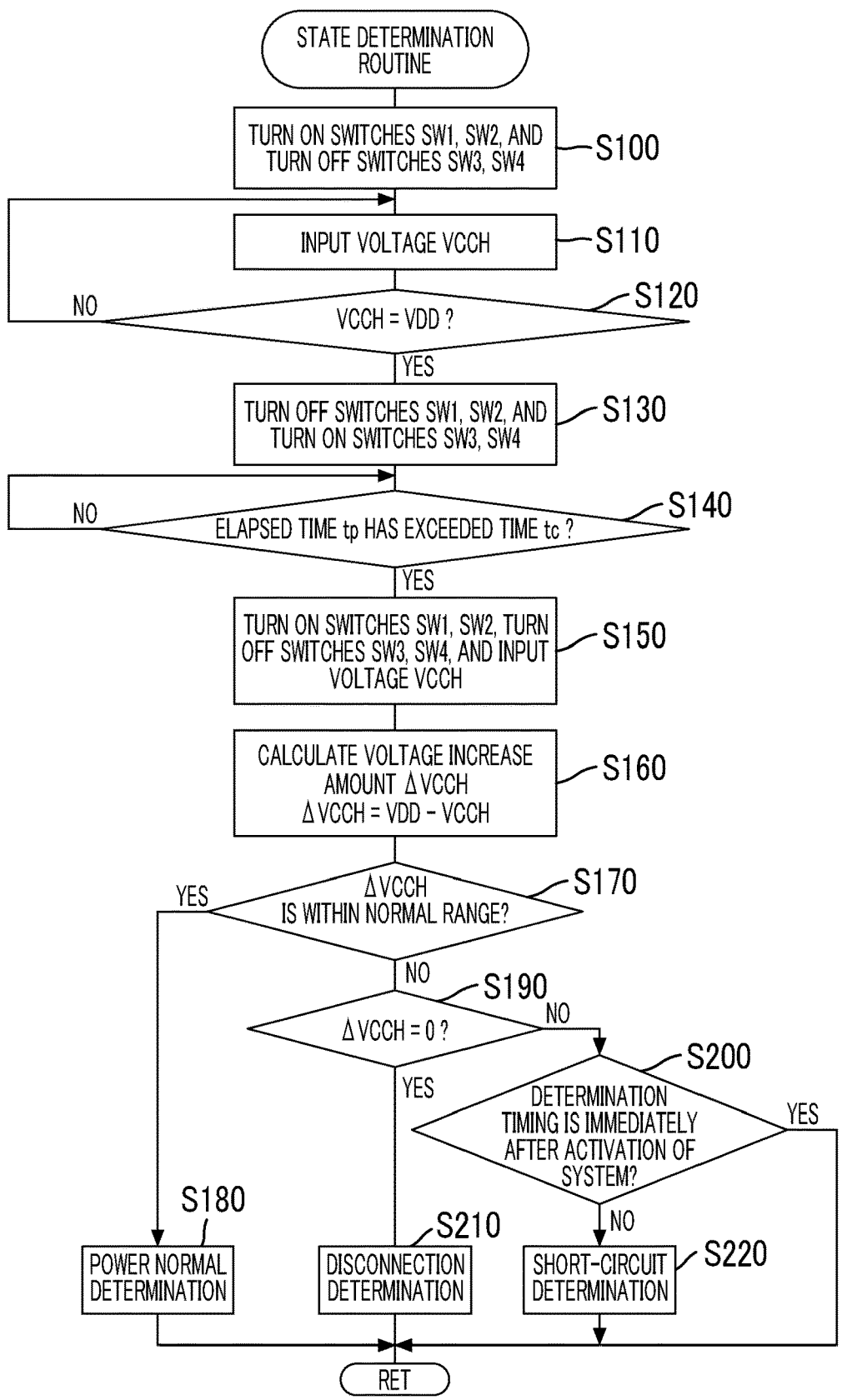
FIG. 2 is a flowchart showing an example of a state determination routine executed by a central processing unit (CPU) of a determination module.

The operation of the battery monitoring device 20 according to the embodiment described above, in particular, the operation when determining a state of power supply from the power supply device 24 to the monitoring modules 22a to 22c will be described. FIG. 2 is a flowchart showing an example of a state determination routine executed by the CPU of the determination module 40. This routine is executed at predetermined time intervals (for example, every several milliseconds) after the system including the battery monitoring device 20 and the battery stacks 50a to 50c that are monitoring targets is activated.

When the routine is executed, the CPU executes processing of turning on the switches SW1, SW2 and turning off all the switches SW3, SW4 (step S100). Through the above processing, the first capacitor 28 is connected to the second power line 36 and disconnected from the first power line 26, and charging of the first capacitor 28 is started.

The CPU receives an input of the voltage VCCH of die first capacitor 28 (step S110) and determines whether or not the voltage VCCH of the first capacitor 28 is the power source voltage VDD (or a predetermined voltage Vref considering the voltage drop at the resistor R) (step S120). In step S110, the voltage VCCH is input from the A/D converter 42 to the CPU. When the voltage VCCH of the first capacitor 28 is less than the power source voltage VDD, the processing of steps S110 and S120 are repealed until the voltage VCCH becomes the power source voltage VDD (or voltage Vref).

When the voltage VCCH becomes the voltage VDD (or voltage Vref) in step S120, the switches SW1, SW2 are turned off and the switches SW3, SW4 provided in the first power line 26 for supplying power to the monitoring module 22a are turned on (step S130), and then a determination is made as to whether or not a time tp elapsed after the switches SW1, SW2 are turned off and the switches SW3, SW4 are turned on (hereinafter referred to as "elapsed time tp") in step S130 has exceeded a time to (step S140). When the elapsed time tp has not exceeded the time tc, the determination is on standby until the elapsed time tp exceeds the time tc. In step S130, the switches SW1, SW2 are turned off, and the switches SW3, SW4 are turned on, whereby the first capacitor 28 and the second capacitors 30 are connected in parallel. When the first capacitor 28 and the second capacitors 30 are connected in parallel, since the electric charge can be exchanged between the first capacitor 28 and the second capacitors 30, the voltage VCCH of the first capacitor 28 becomes a voltage corresponding to charging states of the second capacitors 30. In step S140, the time tc is a time (for example, from 1 µsec to 10 µsec) determined in advance as a time when there is no change in the voltage VCCH of the first capacitor 28 and the voltage VDH1 of the second capacitor 30 due to the exchange of the electric charge between the first capacitor 28 and the second capacitors 30.

When the elapsed time tp has exceeded the time tc in step S140, the CPU turns on the switches SW1, SW2, turns off the switches SW3, SW4 turned on in the processing of step S130, receives an input of the voltage VCCH of the first capacitor 28 from the A/D converter 42 (step S150), and calculates a voltage increase amount ΔVCCH obtained by subtracting the voltage VCCH input in step S150 from the power source voltage VDD (or voltage Vref) (step S160).

A determination is made as to whether the calculated voltage increase amount ΔVCCH is within a normal range (step S170). A relationship between the voltage increase amount ΔVCCH of when the state of power supply from the power supply device 24 to the monitoring module 22a is normal and the state of power supply from the power supply device 24 to the monitoring modules 22a to 22c will be described.

FIG. 3 is a timing chart showing an example of a temporal change of an on-off state of the switches SW1, SW2, an on-off state of the switches SW3, SW4, a voltage VCCH of the first capacitor 28, and a voltage VDH1 of the second capacitor 30 of when the state of power supply from the power supply device 24 to the monitoring module 22a is normal. The monitoring module 22a consumes a power in accordance with the operation of the monitoring IC 23a. When there is no abnormality such as a disconnection or a short-circuit in the first power line 26 between the power supply device 24 and the monitoring module 22a, or in the power supply system within the monitoring module 22a, accordingly, the state is normal, as shown in FIG. 3, in a period during which the switches SW1, SW2 are turned on and the switches SW3, SW4 are turned off (for example, a period P1), the voltage VCCH of the first capacitor 28 increases to the power source voltage VDD (or voltage Vref), and the second capacitor 30 is discharged by the power consumption due to the operation of the monitoring module 22a, so that the voltage VDH1 of the second capacitor 30 decreases. Since the capacity of the second capacitor 30 is adjusted to the capacity to which the voltage VDH1 gradually decreases with respect to the power consumption due to the operation of the monitoring module 22a, a decrease amount of the voltage VDH1 does not become so large. Thereafter, when the switches SW1, SW2 are turned off and the switches SW3, SW4 are turned on (for example, in a period P2), the voltage VCCH decreases and the voltage VDH1 increases until the voltage VCCH of the first capacitor 28 and the voltage VDH1 of the second capacitor 30 become equal to each other while covering the power consumption due to the operation of the monitoring module 22a. When the switches SW1, SW2 are turned on and the switches SW3, SW4 are turned off (for example, in a period P3), the first capacitor 28 is charged, so that the voltage VCCH increases to the power source voltage VDD (or voltage Vref), the electric charge of the second capacitor 30 is discharged by the power consumption due to the operation of the monitoring module 22a, so that the voltage VDH1 of the second capacitor 30 decreases. As described above, when the state of power supply from the power supply device 24 to the monitoring module 22a is normal, the voltage increase amount ΔVCCH of the voltage VCCH in the period P3 becomes an amount corresponding to the voltage VDH1 decreased in the period P1. The "normal range" in step S170 refers to a range of the increase amount in the voltage VCCH in a normal state in which there is no abnormality such as a disconnection or a short-circuit in the first power line 26 between the power supply device 24 and the monitoring module 22a, or in the power supply system within the monitoring module 22a, and is obtained in advance by an experiment, an analysis, or the like (for example, 0.3 V, 0.5 V, or 0.7 V).

When the voltage increase amount ΔVCCH calculated in step S170 is within the normal range, a determination is made that the power supply from the first power line 26 to the monitoring module 22a is normal (power normal determination) (step S180), and the routine ends.

When the voltage increase amount ΔVCCH calculated in step S170 is not within the normal range, a determination is made that an abnormality such as a disconnection or a short-circuit may occur in the first power line 26 for supplying a power from the power supply device 24 to the monitoring module 22a, or in the power supply system within the monitoring module 22a, and determinations are made as to whether or not a value of the voltage increase amount ΔVCCH is zero (step S190), and whether or not a determination timing is immediately after a system including the battery monitoring device 20 and the battery stacks 50a to 50c that are the monitoring targets is activated within a predetermined time from the activation of the system (step S200). The relationship between the voltage increase amount ΔVCCH and a state of power supply from the power supply device 24 to the monitoring modules 22a to 22c of when an abnormality such as a disconnection or a short-circuit occurs in the first power line 26 between the power supply device 24 and the monitoring module 22a, or in the power supply system within the monitoring module 22a will be described.

FIG. 4 is a timing chart showing an example of a temporal change of an on-off state of the switches SW1, SW2, an on-off state of the switches SW3, SW4, the voltage VCCH of the first capacitor 28, and the voltage VDH1 of the second capacitor 30 of when the disconnection occurs in the first power line 26 between the power supply device 24 and the monitoring module 22a, or in the power supply system within the monitoring module 22a. When the disconnection occurs in the first power line 26 between the power supply device 24 and the monitoring module 22a, or in the power supply system within the monitoring module 22a, the second capacitor 30 does not discharge and the voltage VDH1 is maintained even when the switches SW3, SW4 are turned off during the above-described period P1. Therefore, in the period P2, even when the switches SW1, SW2 are turned off, the switches SW1, SW4 are turned on, so that the first capacitor 28 and the second capacitors 30 are connected in parallel, the voltage VCCH of the first capacitor 28 and voltages VDH1 of the second capacitor 30 hardly change, and a value of the voltage increase amount ΔVCCH becomes zero (or a value in the vicinity of zero, for example, 0.05 V, 0.10 V, or 0.15 V).

Figure 5:
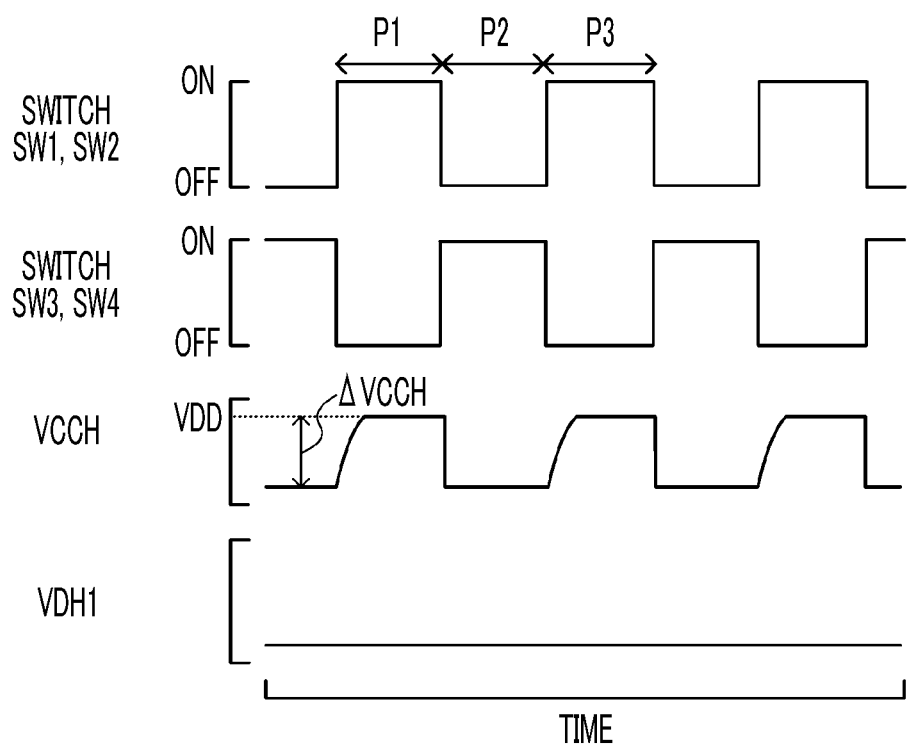
FIG. 5 is a timing chart showing an example of temporal changes of on-off states of the switches, a voltage of the first capacitor, and a voltage of the second capacitor of when a short-circuit occurs in the first power line between the power supply device and the monitoring module, or in the power supply system within the monitoring module.

FIG. 5 is a timing chart showing an example of a temporal change of an on-off state of the switches SW1, SW2, an on-off state of the switches SW3, SW4, the voltage VCCH of the first capacitor 28, and the voltage VDH1 of the second capacitor 30 of when the short-circuit occurs in the first power line 26 between the power supply device 24 and the monitoring module 22a, or in the power supply system within the monitoring module 22a. In a case where the short-circuit occurs in the first power line 26 between the power supply device 24 and the monitoring module 22a, or in the power supply system within the monitoring module 22a, when the switches SW3, SW4 are turned off during the above-described period P1, the second capacitor 30 is discharged and a value of the voltage VDH1 becomes zero. Therefore, in the period P2, when the switches SW1, SW2 are turned off, and the switches SW3, SW4 are turned on, the first capacitor 28 charged during the period P1 is also discharged, so that values of the voltages VCCH of the first capacitor 28 and VDH1 of the second capacitors 30 both become zero and the voltage increase amount ΔVCCH becomes a large value (a value of the power source voltage VDD or in the vicinity of the power source voltage VDD, for example, 4.4 V, 4.6 V, or 4.8 V).

As shown in FIGS. 4 and 5, when the disconnection occurs in the first power line 26 between the power supply device 24 and the monitoring module 22a, or in the power supply system within the monitoring module 22a, the value of the voltage increase amount ΔVCCH becomes zero (or a value in the vicinity of zero), when the short-circuit occurs in the first power line 26 between the power supply device 24 and the monitoring module 22a, or in the power supply system within the monitoring module 22a, the voltage increase amount ΔVCCH becomes a large value (a value of the power source voltage VDD or in the vicinity of the power source voltage VDD, for example, 4.4 V, 4.6 V, or 4.8 V). Therefore, step S190 is processing of determining whether or not a disconnection occurs in the first power line 26 for supplying a power from the power supply device 24 to the monitoring module 22a, or in the power supply system within the monitoring module 22a. Since the second capacitors 30 are not charged immediately after the system including the battery monitoring device 20 and the battery stacks 50a that are monitoring targets is activated, even when the disconnection occurs in the first power line 26 between the power supply device 24 and the monitoring module 22a and in the power supply system within the monitoring module 22a, the voltage increase amount ΔVCCH becomes large, so that it is not possible to distinguish the disconnection and the short-circuit. Step S200 is processing of determining whether or not it is possible to distinguish the disconnection and the short-circuit in the first power line 26 for supplying a power from the power supply device 24 to the monitoring module 22a, or in the power supply system within the monitoring module 22a.

In view of the above, when the value of the voltage increase amount ΔVCCH is zero in step S190, a determination is made that the disconnection occurs in the first power line 26 for supplying a power from the power supply device 24 to the monitoring module 22a, or in the power supply system within the monitoring module 22a (a disconnection determination) (step S210), and the routine ends. When the value of the voltage increase amount ΔVCCH is not zero in step S190 and the determination timing is not immediately after the system including the battery monitoring device 20 and the battery stacks 50a that are monitoring targets is activated in step S200, a determination is made that the short-circuit occurs in the first power line 26 for supplying a power from the power supply device 24 to the monitoring module 22a, or in the power supply system within the monitoring module 22a (short-circuit determination) (step S220), and the routine ends. When the value of the voltage increase amount ΔVCCH is not zero in step S190 and the determination timing is immediately after the system including the battery monitoring device 20 and the battery stacks 50a that are monitoring targets is activated in step S200, a determination is made that it is not possible to distinguish the disconnection and the short-circuit in the first power line 26 for supplying a power from the power supply device 24 to the monitoring module 22a, or in the power supply system within the monitoring module 22a, and the routine ends. By the processing described above, it is possible to determine the state of power supply from the power supply device 24 to the monitoring module 22a.

The state determination routine illustrated in FIG. 2 is sequentially applied to the monitoring modules 22b, 22c. Accordingly, the state of power supply between the monitoring modules 22a to 22c and the power supply device 24 can be separately determined.

With the battery monitoring device 20 according to the embodiment described above, the power supply device 24 is connected to the positive electrode line 36a and the negative electrode line 36b of the second power line 36 to which power of the power source voltage VDD is input via the switches SW1, SW2. The power supply device 24 includes the first capacitor 28 which is connected to the positive electrode lines 26a and the negative electrode lines 26b of the three first power lines 26 via each of the switches SW3, SW4 provided in a corresponding one of the positive electrode lines 26a and the negative electrode lines 26b of the three first power lines 26, and the three second capacitors 30 each of which is provided in a corresponding one of the three first power lines 26 and is connected to the corresponding positive electrode lines 26a and the negative electrode lines 26b of the first power lines 26. Accordingly, the state of power supply between the monitoring modules 22a to 22c and the power supply device 24 can be separately determined.

The determination module 40 can separately determine the state of power supply between the monitoring modules 22a to 22c and the power supply device 24 by determining the state of power supply using the voltage increase amount ΔVCCH of the first capacitor 28 of when the first capacitor 28 is charged.

When the determination timing is immediately after the battery monitoring device 20 is activated, the state of power supply is not determined, so that it is possible to more accurately determine the state of power supply between the monitoring modules 22a to 22c and the power supply device 24.

In the battery monitoring device 20 according to the embodiment, when the voltage increase amount ΔVCCH is out of the normal range in the processing of step S170, the processing after step S190 is executed; however, even when the voltage increase amount ΔVCCH is out of the normal range in the processing of step S170, a determination is made that an abnormality occurs in the power supply between the monitoring module 22a and the power supply device 24 without executing the processing after step S190.

In the battery monitoring device 20 according to the embodiment, when the determination timing is immediately after the battery monitoring device 20 is activated, a determination of the state of power supply is not made. When at least one of the three second capacitors 30 has the number of times of charging less than a predetermined number, the state of power supply may not be determined for the monitoring module to which power is supplied from the first power line 26 connected to the second capacitor 30 having the number of times of charging less than the predetermined number. The "predetermined number" is a threshold for determining whether or not the voltage of the second capacitor 30 increases sufficiently immediately after the battery monitoring device 20 is activated. When the voltage VDH1 of the second capacitor 30 is not sufficiently increased, since the voltage increase amount ΔVCCH of the first capacitor 28 becomes large regardless of the state of power supply between the monitoring modules 22a to 22c and power supply device 24, the state of power supply between the monitoring modules 22a to 22c and the power supply device 24 cannot be accurately determined. Accordingly, when at least one of the three second capacitors 30 has the number of times of charging less than a predetermined number, the slate of power supply is not determined for the monitoring module to which power is supplied from the first power line 26 connected to the second capacitor 30 having the number of times of charging less than the predetermined number, so that it is possible to more accurately determine the state of power supply between the monitoring modules 22a to 22c and the power supply device 24.

In the embodiment, the present disclosure is applied to the battery including the three battery stacks 50a to 50c composed of a plurality of battery cells; however the number of battery stacks is not limited to three, and the present disclosure may be applied to any battery as long as the battery includes a plurality of battery stacks.

The correspondence between the main elements of the embodiment and the main elements of the present disclosure described in "SUMMARY" will be described. In the embodiment, the monitoring modules 22a to 22c are examples of "a plurality of monitoring modules", the power supply device 24 is an example of a "power supply device", the determination module 40 is an example of a "determination module", the first capacitor 28 is an example of a "first capacitor", and the second capacitor 30 is an example of a "second capacitor".

Since the embodiment is an example for describing specifically the aspect of the present disclosure described in "SUMMARY", the elements of the present disclosure described in "SUMMARY" are not limited to the correspondence between the main elements of the embodiment and the main elements of the present disclosure described in "SUMMARY". That is, the interpretation of the present disclosure described in "SUMMARY" should be made based on the description of "SUMMARY", and the embodiment is merely a specific example of the present disclosure described in "SUMMARY".

As above, although the embodiment of the present disclosure have been described, an applicable embodiment of the present disclosure is not limited to the above-described embodiment, and can be also implemented in various forms within the scope without departing from the gist of the present disclosure.

The present disclosure Is applicable to an industry for manufacturing a battery monitoring device, or the like.

What is claimed is:

1. A battery monitoring device for a battery including a plurality of battery stacks, the battery monitoring device comprising:
a plurality of monitoring modules, each being disposed in a corresponding one of the battery stacks and configured to monitor a state of the corresponding one of the battery stacks;
a power supply device including a plurality of first power lines, a first switch, a first capacitor, a second power line, a plurality of second switches, and a plurality of second capacitors, in which each of the first power lines includes a first positive electrode line and a first negative electrode line, each of the first power lines is connected to a corresponding one of the monitoring modules so as to supply a power to the monitoring modules, the second power line includes a second positive electrode line and a second negative electrode line, the second power line is configured to receive a predetermined amount of power, the first capacitor is configured to be connected to the second positive electrode line and the second negative electrode line of the second power line via the first switch and to be connected to the first power lines via the second switches, and each of the second capacitors is configured to be connected to the first positive electrode line and the first negative electrode line of a corresponding one of the first power lines; and
a determination module configured to determine a state of power supply from the power supply device to the monitoring modules.

2. The battery monitoring device according to claim 1, wherein the determination module is configured to determine the state of power supply by using an increase amount in a voltage of the first capacitor of when the first capacitor is charged.

3. The battery monitoring device according to claim 2, wherein the determination module is configured to prohibit determination of the state of power supply within a predetermined time after the battery monitoring device is activated.

4. The battery monitoring device according to claim 2, wherein when at least one of the second capacitors has the number of times of charging less than a predetermined number, the determination module is configured to prohibit determination of the state of power supply for the monitoring module to which power is supplied from the first power line connected to the second capacitor having the number of times of charging less than the predetermined number.

5. The battery monitoring device according to claim 1, wherein the determination module is a central processing unit.

6. A power state monitoring method of a battery monitoring device for a battery including a plurality of battery stacks, in which the battery monitoring device includes a plurality of monitoring modules and a power supply device, each of the monitoring modules is disposed in a corresponding one of the battery stacks and is configured to monitor a state of the corresponding one of the battery stacks, the power supply device includes a plurality of first power lines, a first switch, a first capacitor, a second power line, a plurality of second switches, and a plurality of second capacitors, each of the first power lines includes a first positive electrode line and a first negative electrode line, each of the first power lines is connected to a corresponding one of the monitoring modules so as to supply a power to the monitoring modules, the second power line includes a second positive electrode line and a second negative electrode line, the second power line is configured to receive a predetermined amount of power, the first capacitor is configured to be connected to the second positive electrode line and the second negative electrode line of the second power line via the first switch and to be connected to the first power lines via the second switches, and each of the second capacitors is configured to be connected to the first positive electrode line and the first negative electrode line of corresponding one of the first power lines,
the power state monitoring method comprising:
determining a state of power supply from the power supply device to the monitoring modules by using an increase amount in a voltage of the first capacitor when the first capacitor is charged.

* * * * *

UNITED STATES PATENT AND TRADEMARK OFFICE
CERTIFICATE OF CORRECTION

PATENT NO. : 10,613,152 B2  
APPLICATION NO. : 16/146091  
DATED : April 7, 2020  
INVENTOR(S) : Hidenori Matsutou It is certified that error appears in the above-identified patent and that said Letters Patent is hereby corrected as shown below:

On the Title Page

Item (72), inventor, city, delete "Toyota" and insert --Toyota-shi Aichi-ken--, therefor.

In the Specification

In Column 2, Line(s) 31 & 32, delete "to the target monitoring module to the target monitoring module" and insert --to the target monitoring module--, therefor.

In Column 3, Line(s) 16, delete "lime" and insert --time--, therefor.

In Column 3, Line(s) 24, delete "stale" and insert --state--, therefor.

In Column 3, Line(s) 37, delete "Bach" and insert --Each--, therefor.

In Column 4, Line(s) 7 & 8, delete "to the target monitoring module to the target monitoring module" and insert --to the target monitoring module--, therefor.

In Column 6, Line(s) 27, delete "die" and insert --the--, therefor.

In Column 6, Line(s) 35, delete "repealed" and insert --repeated--, therefor.

In Column 6, Line(s) 46, delete "to" and insert --tc--, therefor.

In Column 10, Line(s) 64, delete "slate" and insert --state--, therefor.

In Column 11, Line(s) 37, delete "Is" and insert --is--, therefor.

Signed and Sealed this  
Second Day of June, 2020

Andrei Iancu  
*Director of the United States Patent and Trademark Office*